United States Patent
Fujiyoshi et al.

(10) Patent No.: US 12,174,047 B2
(45) Date of Patent: Dec. 24, 2024

(54) CAPACITANCE DETECTION DEVICE AND CAPACITANCE DETECTION METHOD

(71) Applicant: Alps Alpine Co., Ltd., Tokyo (JP)

(72) Inventors: Tatsumi Fujiyoshi, Miyagi-ken (JP); Atsushi Matsuda, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 170 days.

(21) Appl. No.: 18/162,507

(22) Filed: Jan. 31, 2023

(65) Prior Publication Data

US 2023/0175870 A1  Jun. 8, 2023

Related U.S. Application Data (63) Continuation of application No. PCT/JP2021/019641, filed on May 24, 2021.

(30) Foreign Application Priority Data

Aug. 20, 2020 (JP) .............................. 2020-139645

(51) Int. Cl.
  *G01D 5/24* (2006.01)
  *G01R 27/26* (2006.01)

(52) U.S. Cl.
  CPC ....... *G01D 5/2403* (2021.05); *G01R 27/2605* (2013.01)

(58) Field of Classification Search
  CPC .. G01D 5/2403; G01R 27/2605; G01R 23/16; G01R 27/02; G01B 7/00
  USPC ........................................ 324/658, 649, 600
  See application file for complete search history.

(56) References Cited

U.S. PATENT DOCUMENTS

| | | | |
|---|---|---|---|
| 11,481,072 B2 * | 10/2022 | Fan ..................... | H03K 17/962 |
| 11,853,498 B2 * | 12/2023 | Healy .................. | G06F 3/0446 |
| 2011/0084709 A1 | 4/2011 | Asjes et al. | |
| 2011/0285411 A1 | 11/2011 | Shirai | |
| 2019/0294297 A1 | 9/2019 | Sasai et al. | |
| 2020/0141989 A1 | 5/2020 | Hargreaves et al. | |
| 2023/0058404 A1 * | 2/2023 | Iikura .................. | G06F 3/0418 |

FOREIGN PATENT DOCUMENTS

| | | |
|---|---|---|
| JP | 2002-350477 | 12/2002 |
| JP | 2003-75482 | 3/2003 |
| JP | 2011-525323 | 9/2011 |
| JP | 2011-247610 | 12/2011 |
| WO | 2018/116706 | 6/2018 |

OTHER PUBLICATIONS

International Search Report from International Application No. PCT/JP2021/019641 dated Aug. 10, 2021.

* cited by examiner

*Primary Examiner* — Giovanni Astacio-Oquendo
(74) *Attorney, Agent, or Firm* — Beyer Law Group LLP (57) ABSTRACT

A capacitance detection device includes at least one detection electrode, a shield electrode disposed in close vicinity of the detection electrode, an AC signal source that supplies an AC signal to the shield electrode, a detection circuit that detects capacitance between a physical object in close vicinity of the detection electrode and the detection electrode on the basis of a detection signal output from the detection electrode and the AC signal output from the AC signal source, and a phase adjustment circuit provided between the AC signal source and the shield electrode. The phase adjustment circuit advances the phase of the AC signal output from the AC signal source.

11 Claims, 8 Drawing Sheets

PHASE DELAY α1 OF G1

FIG. 9B

PHASE DELAY α4 OF G4

| DETECTION TARGET GROUP | G1 | G2 | G3 | G4 | G1 | G2 | G3 | G4 |
|---|---|---|---|---|---|---|---|---|
| PHASE ADJUSTMENT AMOUNT | α1 | α2 | α3 | α4 | α1 | α2 | α3 | α4 |
| TIME SEGMENT | T1 | T2 | T3 | T4 | T1 | T2 | T3 | T4 |

…

CAPACITANCE DETECTION DEVICE AND CAPACITANCE DETECTION METHOD

CLAIM OF PRIORITY

This application is a Continuation of International Application No. PCT/JP2021/019641 filed on May 24, 2021, which claims benefit of Japanese Patent Application No. 2020-139645 filed on Aug. 20, 2020. The entire contents of each application noted above are hereby incorporated by reference.

BACKGROUND OF THE INVENTION

1. Field of the Invention

The present invention relates to a capacitance detection device and a capacitance detection method.

2. Description of the Related Art

An impedance detection circuit has been developed that is capable of outputting a signal proportional to the capacitance to be measured. The impedance detection circuit includes an AC signal generator that generates an AC signal, an operational amplifier including an inverting input terminal, a non-inverting input terminal, and an output terminal, where the output terminal and the inverting input terminal are connected by a feedback resistor and where the AC signal is applied to the non-inverting input terminal, a signal line having one end connected to the inverting input terminal, where the capacitance to be measured can be connected to the other end, a shield line that allows the signal line to be partially exposed and that is connected to the non-inverting input terminal, and a compensation circuit that receives the AC signal and compensates the phase and amplitude of the AC signal, where the output of the compensation circuit is connected to the inverting input terminal of the operational amplifier (refer to, for example, Japanese Unexamined Patent Application Publication No. 2002-350477).

In existing impedance detection circuits, phase compensation is performed so that the phase delay of the input to the inverting input terminal caused by the parasitic capacitance of the signal line and the feedback resistance do not affect the phase of the output of the operational amplifier. However, since the phase of the input to the inverting input terminal of the operational amplifier remains unchanged, a phase difference occurs between the input to the inverting input terminal and the input to the non-inverting input terminal of the operational amplifier. For this reason, even if the output of the compensation circuit is input to the inverting input terminal, the phase delay of the input of the capacitance to be detected to the inverting input terminal with respect to the phase of the input to the non-inverting input terminal does not disappear. The reason is as follows: An interconnection wire from the capacitance to be detected to the inverting input terminal has a resistance value, and the input to be detected needs to be taken out as a current. At this time, a potential difference occurs between the voltage of the non-inverting input terminal and the voltage of an electrode of the capacitance. In such a compensation technique, if, in particular, the resistance of the interconnection wire between a detection target and the inverting input terminal is high or if the parasitic capacitance existing in the interconnection wire is large, the phase delay of the input current to be detected due to the influence of the resistance value is not substantially corrected. As a result, the output sensitivity (the detection sensitivity) of the operational amplifier is decreased.

SUMMARY OF THE INVENTION

The present invention provides a capacitance detection device and a capacitance detection method capable of reducing a decrease in detection sensitivity due to a signal phase delay.

According to an embodiment of the present invention, a capacitance detection device includes at least one detection electrode, a shield electrode disposed in close vicinity of the detection electrode, an AC signal source that supplies an AC signal to the shield electrode, a detection circuit that detects capacitance between a physical object in close vicinity of the detection electrode and the detection electrode on a basis of a detection signal output from the detection electrode and the AC signal output from the AC signal source, and a phase adjustment circuit provided between the AC signal source and the shield electrode. The phase adjustment circuit advances the phase of the AC signal output from the AC signal source.

DESCRIPTION OF THE PREFERRED EMBODIMENTS

Embodiments to which a capacitance detection device and a capacitance detection method according to the present invention are applied are described below.

EMBODIMENTS

Figure 1:
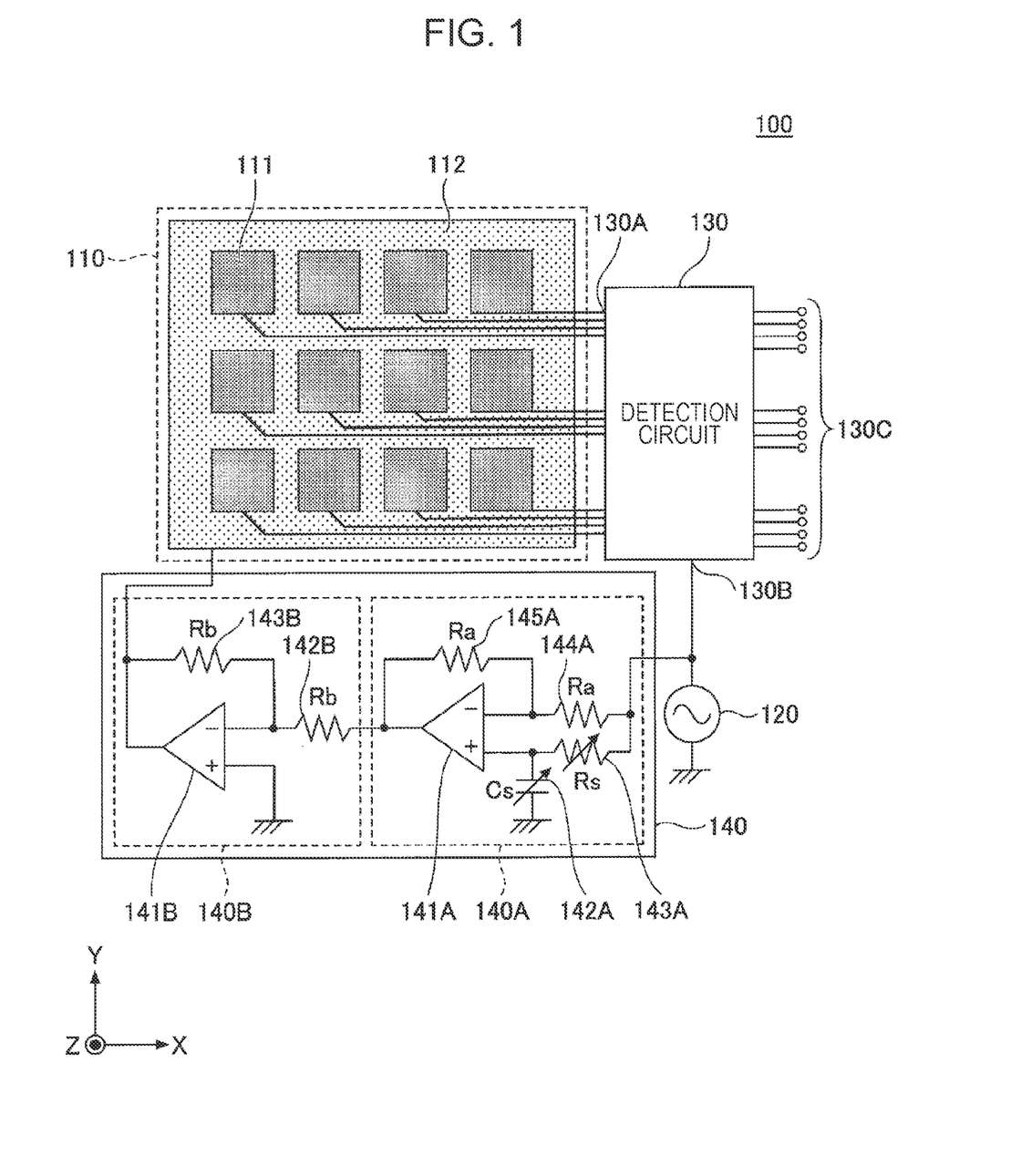
FIG. 1 illustrates a capacitance detection device according to an embodiment.

FIG. 1 illustrates a capacitance detection device 100 according to the embodiment. The capacitance detection device 100 includes a sensor unit 110, an AC signal source 120, a detection circuit 130, and a phase adjustment circuit 140. The capacitance detection method is a method for adjusting a phase (described below) to detect the capacitance by using the capacitance detection device 100.

Hereinafter, the sensor unit 110 is described by defining an XYZ coordinate system. In addition, for convenience of description, in the sensor unit 110, the −Z direction side is referred to as the lower side or the bottom, and the +Z direction side is referred to as the upper side or the top. However, this does not represent a universal vertical relationship. Furthermore, in terms of the sensor unit 110, XY-plane view is referred to as plan view.

The sensor unit 110 includes, for example, 12 detection electrodes 111 and one active shield electrode 112. The 12 detection electrodes 111 are arranged in a matrix of 3 rows×4 columns. The detection electrode 111 is an electrode that detects the capacitance between the detection electrode 111 and the human body (typically the hand) by a self-capacitance method. For example, the detection electrode 111 is made of a conductive material, such as IOT (indium Tin Oxide) film, with a sheet resistance of several 10 Ω/▫ to about 100Ω/▫. This is the level that causes an effect of reducing the sensitivity in the existing technique. The human body, such as the hand, is an example of a physical object that is a detection target of the capacitance detection device 100.

Note that an ITO film or the like serving as a conductive material provides such a large time constant that if the phase adjustment circuit 140 (described below) does not adjust the phase of an AC signal applied to the active shield electrode 112, phase delay that decreases the detection sensitivity of the detection circuit 130 occurs in the AC signal propagating in the detection electrode 111. For example, the detection electrode 111 is formed on a surface of the transparent substrate. The material of the detection electrode 111 is not limited to ITO and may be zinc oxide, tin oxide, titanium oxide, or the like. In addition, the detection electrode 111 need not be transparent.

The active shield electrode 112 is disposed at a position so as to overlap the 12 detection electrodes 111 in plan view and is provided under (at the back side of) the 12 detection electrodes 111. In addition, an AC signal source 120 is connected to the active shield electrode 112 via a phase adjustment circuit 140. The active shield electrode 112 is provided to shield the 12 detection electrodes 111 from noise and to reduce parasitic capacitance. An AC signal that is output from the AC signal source 120 and that has a phase advanced by the phase adjustment circuit 140 is applied to the active shield electrode 112.

For example, the active shield electrode 112 is made of a conductive material, such as an ITO film. The effect of phase delay due to the use of the ITO film for the active shield electrode 112 is the same as that for the detection electrode 111, and the effect is that the active shield electrode 112 has a resistance value that causes such a large time constant that the phase delay that decreases the detection sensitivity of the detection circuit 130 occurs in an AC signal propagating through the active shield electrode 112 if the phase adjustment circuit 140 (described below) does not adjust the phase of the AC signal applied to the active shield electrode 112.

The active shield electrode 112 is disposed in close proximity to the 12 detection electrodes 111. The active shield electrode 112 in close proximity to the 12 detection electrodes 111 means the active shield electrode 112 located close to the 12 detection electrodes 111 so that the active shield electrode 112 can shield the 12 detection electrodes 111 mainly from noise coming from below and reduce parasitic capacitance due to the coupling with parts around and below the active shield electrode 112. Note that the material of the active shield electrode 112 is not limited to ITO and may be zinc oxide, tin oxide, titanium oxide, or the like. In addition, the active shield electrode 112 need not be transparent.

The AC signal source 120 supplies an AC signal to the active shield electrode 112. More specifically, the AC signal source 120 includes an output terminal connected to the input terminal of phase adjustment circuit 140 and outputs an AC signal to the phase adjustment circuit 140. The AC signal output from the AC signal source 120 is supplied to the active shield electrode 112 with its phase advanced by the phase adjustment circuit 140. The frequency of the AC signal is, for example, 30 kHz to 300 kHz.

The detection circuit 130 detects the capacitance between a physical object in close proximity to the detection electrode 111 and the detection electrode 111 on the basis of the detection signal output from the detection electrode 111 and the AC signal output from the AC signal source 120. More specifically, the detection circuit 130 includes 12 input terminals 130A, one input terminal 130B, and 12 output terminals 130C. The 12 input terminals 130A are connected to the 12 detection electrodes 111 in a one-to-one manner. The input terminal 130B is connected to the output terminal of the AC signal source 120. The 12 output terminals 130C are connected to an electronic device including the capacitance detection device 100, an electronic device disposed outside the capacitance detection device 100, or the like. The electronic device may be any electronic device that uses the capacitance detection device 100 as an input device. Examples of the electronic device includes a smartphone, a tablet, and a copying machine.

Figure 2:
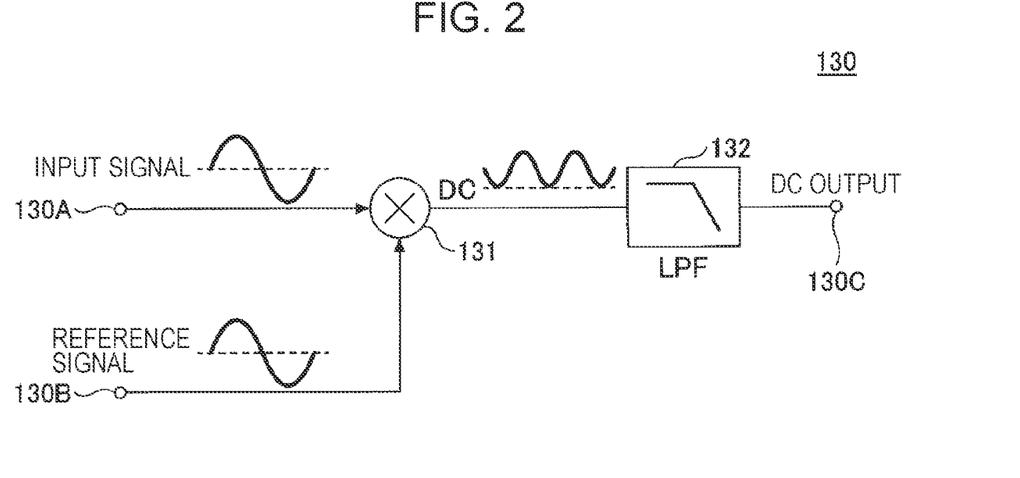
FIG. 2 illustrates the configuration of a detection circuit.

The detection circuit 130 is described below with reference to FIG. 2. FIG. 2 illustrates the configuration of the detection circuit 130. The details of circuits that physically configure the detection circuit 130 are not illustrated. The detection circuit 130 includes a multiplier 131 and a low pass filter (LPF) 132. The detection circuit 130 includes 12 multipliers 131 and 12 LPFs 132. Note that FIG. 2 illustrates only one multiplier 131 and only one LPF 132.

The input terminal 130A is connected to one of two input terminals of the multiplier 131, and the input terminal 130B is connected to the other input terminal. An output terminal of the multiplier 131 is connected to an input terminal of the LPF 132. An input signal input from the detection electrode 111 to the input terminal 130A is a signal obtained by superimposing an AC signal propagating from the active shield electrode 112 on a signal obtained from the capacitance between the detection electrode 111 and the physical object, such as the hand. An input signal input to the input terminal 130B is the AC signal output from the AC signal source 120.

The input signal input to the input terminal 130A is a signal generated as follows: the phase of the AC signal output from the AC signal source 120 is advanced by the phase adjustment circuit 140, the phase is delayed when the AC signal propagates through the active shield electrode 112 and the detection electrode 111, and a signal based on a capacitance with a physical object, such as the hand, is superimposed on the AC signal. The phase adjustment circuit 140 advances the phase of the AC signal output from AC signal source 120 so that the phase of the input signal input to the input terminal 130A is the same as the phase of the input signal input to the input terminal 130B and outputs the AC signal to the active shield electrode 112. Therefore, the phase of the input signal input to the input terminal 130A is the same as the phase of the input signal input to the input terminal 130B, and the signals having the same phase are input to the two input terminals of the multiplier 131.

When the signals that are the same are input to the two input terminals of the multiplier 131 and are multiplied, a signal having a frequency doubled and superimposed on the direct current (DC) component is obtained, and the obtained signal is input from the output terminal of the multiplier 131 to the LPF 132. The LPF 132 allows band components below a predetermined cutoff frequency of the output of the multiplier 131 to pass therethrough and outputs the band components from the output terminal 130C. The output of the LPF 132 is a DC component corresponding to the signal obtained based on the capacitance between detection electrode 111 and the physical object, such as the hand.

The phase adjustment circuit 140 is provided between the AC signal source 120 and the active shield electrode 112 and advances the phase of the AC signal output from the AC signal source 120. In particular, the phase adjustment circuit 140 advances the phase of the AC signal so that the detection signal input to the detection circuit 130 and the AC signal are in phase. More specifically, the phase adjustment circuit 140 includes a phase shift circuit 140A and an inverting amplifier circuit 140B. The phase shift circuit 140A includes an operational amplifier 141A, a variable capacitor 142A, a variable resistor 143A, and resistors 144A and 145A. The inverting input terminal and the non-inverting input terminal of the operational amplifier 141A are connected to the output terminal of the AC signal source 120 via the resistor 144A and the variable resistor 143A, respectively. The resistor 145A serving as a feedback resistor is connected between the inverting input terminal and the output terminal of the operational amplifier 141A. The resistance values of the resistors 144A and 145A are both Ra. One end of the variable capacitor 142A is connected between the non-inverting input terminal of the operational amplifier 141A and the variable resistor 143A. The other end of the variable capacitor 142A is connected to ground. The output terminal of the operational amplifier 141A is connected to the input terminal of the inverting amplifier circuit 140B.

The phase shift circuit 140A can variably control the input voltage of the non-inverting input terminal of the operational amplifier 141A by changing a capacitance Cs of the variable capacitor 142A and the resistance value Rs of the variable resistor 143A. That is, the phase shift circuit 140A delays the phase of the AC signal output from the output terminal of the operational amplifier 141A relative to the AC signal input to the inverting input terminal by controlling the input voltage of the non-inverting input terminal of the operational amplifier 141A.

The inverting amplifier circuit 140B includes an operational amplifier 141B and resistors 142B and 143B. The non-inverting input terminal of the operational amplifier 141B is connected to ground, and the inverting input terminal of the operational amplifier 141B is connected to the output terminal of the operational amplifier 141A of the phase shift circuit 140A via the resistor 142B. An output terminal of the operational amplifier 141B is connected to the active shield electrode 112. The resistor 143B serving as a feedback resistor is connected between the inverting input terminal and the output terminal of the operational amplifier 141B. The resistance values of the resistors 142B and 143B are both Rb. The inverting amplifier circuit 140B inverts the phase of the AC signal input to the inverting input terminal of the operational amplifier 141B (shifts the phase by 180 degrees) and outputs the AC signal.

Herein, the amount of phase delay that occurs in the AC signal due to the time constant of the active shield electrode 112 and detection electrode 111 and the interconnection wires or the like connected to the active shield electrode 112 and the detection electrode 111 is defined as α degrees. The phase adjustment circuit 140 delays the phase of the AC signal input from AC signal source 120 by (π−α) degrees by using the phase shift circuit 140A, inverts the phase by using inverting amplifier circuit 140B, and outputs the AC signal. Thus, the phase of the AC signal output from the phase adjustment circuit 140 leads the phase of the AC signal input to the phase adjustment circuit 140 by α degrees. The capacitance Cs and resistance Rs can be determined such that after α (degrees) is measured by experiments or simulations, a delay of α degrees is achieved using a time constant RsCs determined by the capacitance Cs of the variable capacitor 142A of the phase shift circuit 140A and the resistance value Rs of the variable resistor 143A.

Figure 3:
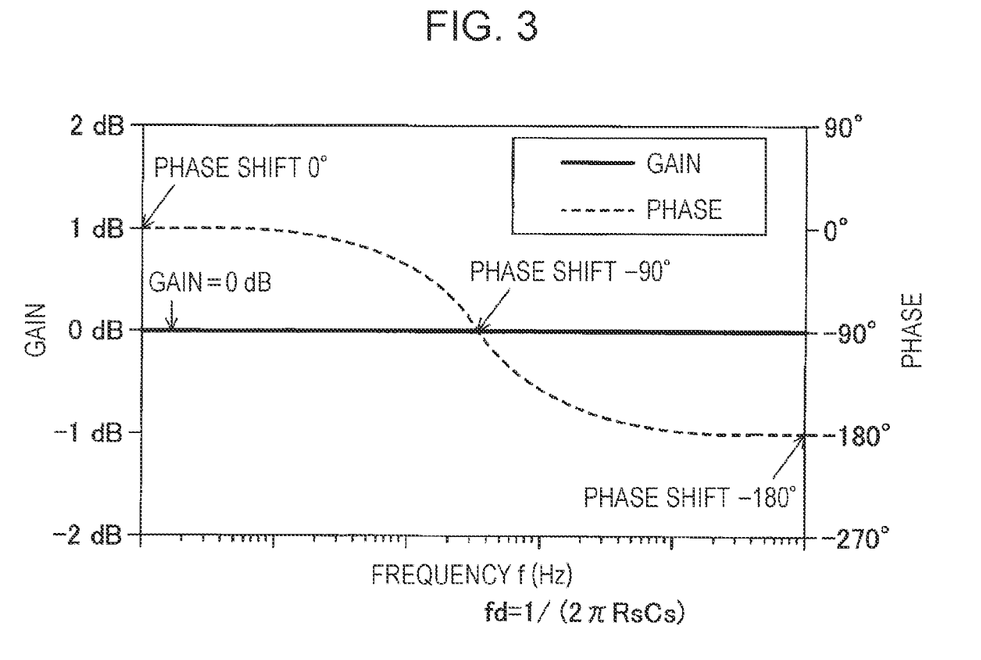
FIG. 3 illustrates simulation results of the phase/gain—frequency characteristics of an output signal with respect to an input signal of a phase shift circuit.

FIG. 3 illustrates the simulation results of frequency characteristics of the phase and gain of the output signal with respect to the input signal of the phase shift circuit 140A. In FIG. 3, the abscissa represents frequency f, and the frequency at which the phase shift is −90 degrees is fd=1/(2πRsCs) (Hz). The frequency fd on the abscissa is the frequency determined by the time constant RsCs determined by the capacitance Cs of the variable capacitor 142A of the phase shift circuit 140A and the resistance value Rs of the variable resistor 143A. The ordinate in FIG. 3 represents the phase and the gain of the output signal of the phase shift circuit 140A. The phase is denoted by a dashed line, and the gain is denoted by a solid line.

As illustrated in FIG. 3, the phase continuously changes from 0 degrees (phase shift of 0 degrees) to −180 degrees (phase shift of −180 degrees). Even when the frequency f changes, the gain is 0 dB. As can be seen from the above, the phase shift circuit 140A can shift the phase of the output signal with respect to the input signal from 0 degrees to −180 degrees, and the signal levels of the input signal and the output signal do not change.

When the phase of the output signal of the phase shift circuit 140A having such a configuration is inverted by the inverting amplifier circuit 140B, the phase of the output signal of the inverting amplifier circuit 140B is shifted from −180 degrees to −360 degrees with respect to the phase of the input signal of the phase shift circuit 140A. That is, the phase adjustment circuit 140 can advance the phase of the input signal of the phase shift circuit 140A by 0 degrees to 180 degrees.

Figure 4A:
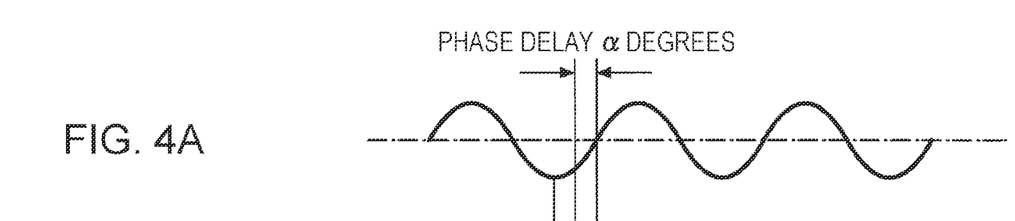
FIGS. 4A to 4D illustrate the phase relationship among signals obtained between an AC signal source and a detection electrode.
Figure 4B:
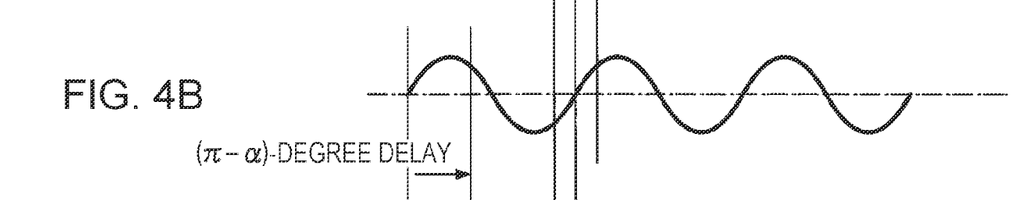
Figure 4C:
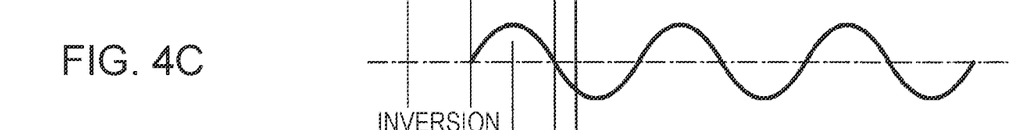
Figure 4D:
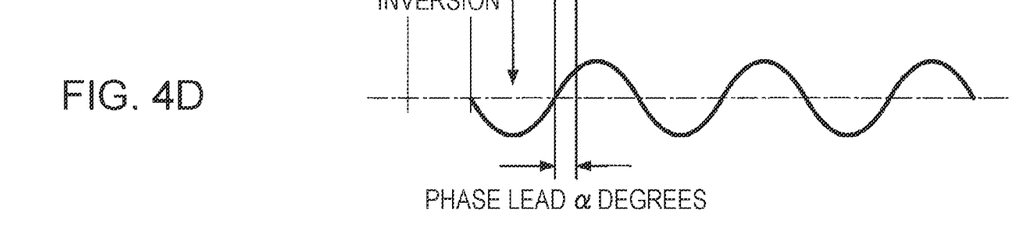

FIGS. 4A to 4D illustrate the phase relationship of signals obtained between the AC signal source 120 and the detection electrode 111. FIG. 4A illustrates the phase of the output signal of the detection electrode 111 when the phase adjustment amount in the phase adjustment circuit 140 is 0 degrees. FIG. 4B illustrates the phase of the AC signal of the AC signal source 120. FIG. 4C illustrates the phase of the output signal of the phase shift circuit 140A. FIG. 4D illustrates the phase of the output signal of the inverting amplifier circuit 140B.

When the phase of the AC signal of the AC signal source 120 illustrated in FIG. 4B is used as a reference, the phase of the output signal of the detection electrode 111 illustrated in FIG. 4A when the adjustment amount in the phase adjustment circuit 140 is 0 degrees is delayed by α degrees. In addition, as illustrated in FIG. 4C, the phase of the output signal of the phase shift circuit 140A is delayed by (π−α) degrees with respect to the phase of the AC signal of the AC signal source 120 illustrated in FIG. 4B. The phase of the output signal of the inverting amplifier circuit 140B illustrated in FIG. 4D leads the phase of the AC signal of the AC signal source 120 illustrated in FIG. 4B by α degrees. As illustrated in FIG. 4D, if an AC signal having a phase advanced with respect to the AC signal of the AC signal source 120 by α degrees is input to the active shield electrode 112, the AC signals input to the two input terminals of the multiplier 131 of the detection circuit 130 can be in phase.

Figure 5A:
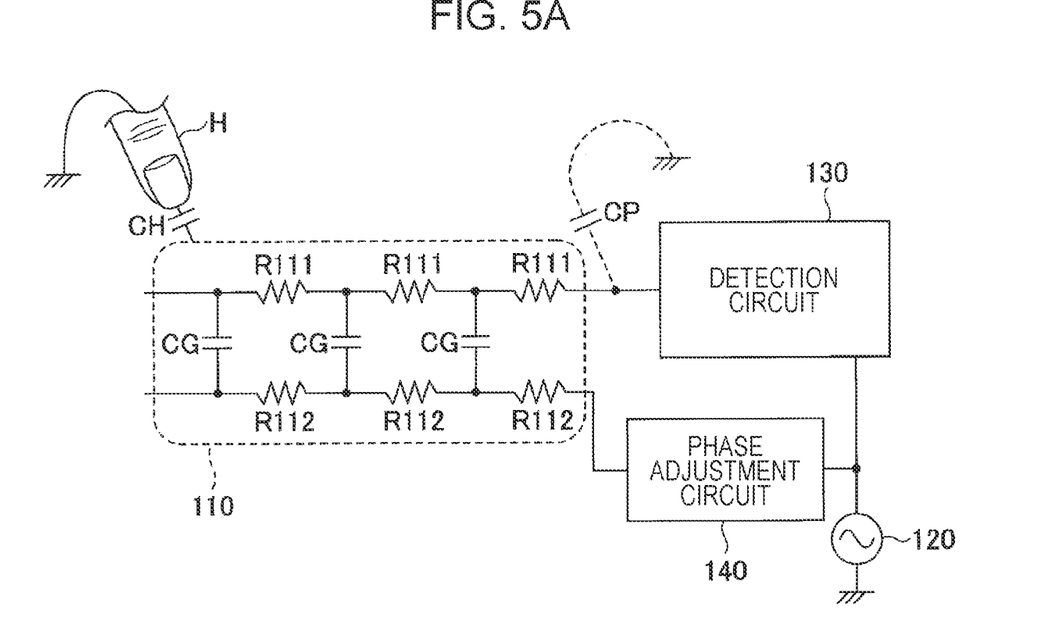
FIGS. 5A and 5B illustrate the resistance and capacitance in the sensor unit of the capacitance detection device.
Figure 5B:
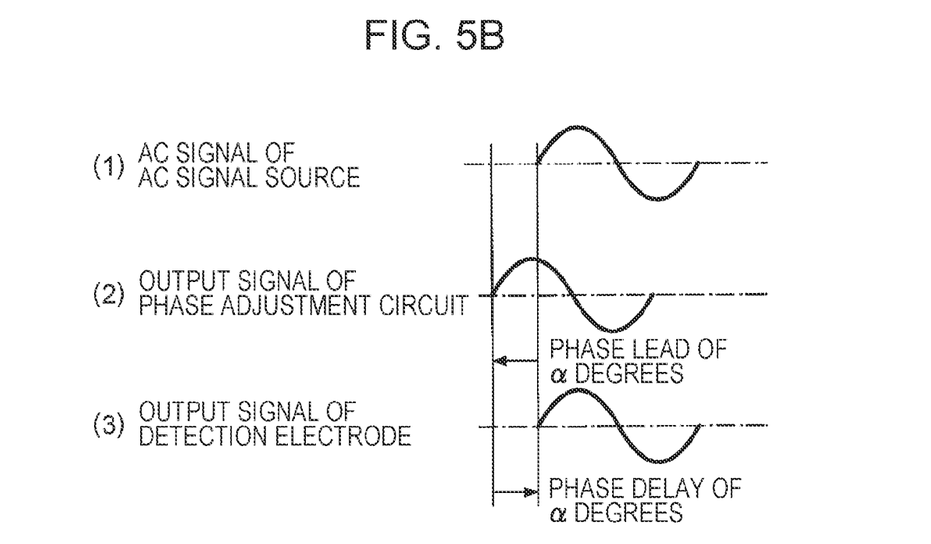

FIGS. 5A and 5B is a schematic illustration of the resistance and capacitance of the sensor unit 110 of the capacitance detection device 100. FIG. 5A illustrates a portion of the sensor unit 110 and a portion of the active shield electrode 112 corresponding to one of the detection electrodes 111. The detection electrode 111 is illustrated as a resistor R111, and the active shield electrode 112 is illustrated as resistors R112. In addition, the capacitance generated in a gap between the detection electrode 111 and the active shield electrode 112 is illustrated as a capacitor CG, the capacitance between the hand H and the detection electrodes 111 is illustrated as a capacitor CH, and the parasitic capacitance of the detection electrodes 111 is illustrated as a capacitor CP.

The AC signal input to the active shield electrode 112 flows to the detection electrode 111 via the capacitor CG. Since the sensor unit 110 has the resistors R111 and R112 as resistance values and has the capacitors CG, CH, and CP, there is a time constant based on the resistance values of the resistors R111 and R112 and the capacitance values of the capacitors CG, CH, and CP. The time constant causes phase delay of the AC signal output from the detection electrode 111 with respect to the AC signal input to the active shield electrode 112.

In FIG. 5B, as indicated by (2), the phase of the output signal of the phase adjustment circuit 140 leads the phase of the AC signal of the AC signal source 120 indicated by (1) by α degrees. If the AC signal whose phase is advanced with respect to the AC signal of the AC signal source 120 by α degrees is input to the active shield electrode 112, the phase of the output signal of the detection electrode 111 is delayed with respect to the AC signal input to the active shield electrode 112 by α degrees as indicated by (3). Therefore, the output signal of the detection electrode 111 and the AC signal of the AC signal source 120 indicated by (1) are in phase. Thus, two AC signals having the same phase can be input to the two input terminals of the multiplier 131.

Figure 6:
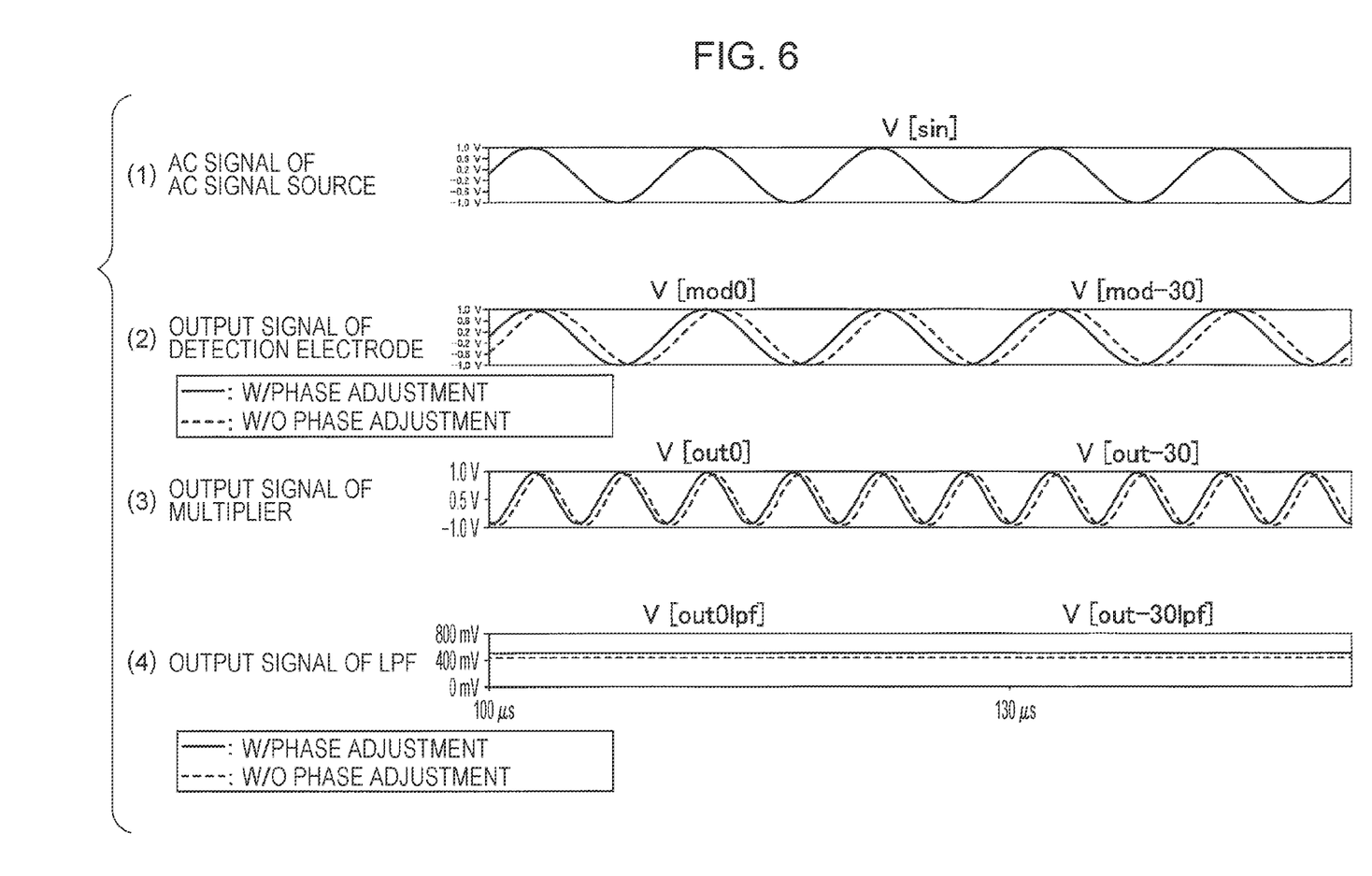
FIG. 6 illustrates signal waveforms in units of the capacitance detection device.

FIG. 6 illustrates the signal waveform of each of elements of the capacitance detection device 100. FIG. 6 illustrates (1) the AC signal of the AC signal source 120; (2) the output signal of the detection electrode 111; (3) the output signal of the multiplier 131; and (4) the output signal of the LPF 132. In terms of (2) the output signal of the detection electrode 111 and (4) the output signal of the LPF 132, the signal waveform when the phase is adjusted by the phase adjustment circuit 140 is denoted by a solid line, and the signal waveform when the phase is not adjusted by the phase adjustment circuit 140 is denoted by a dashed line.

When the phase is adjusted by the phase adjustment circuit 140, the phases of the AC signal of the AC signal source 120 indicated by (1) and (2) the output signal of the detection electrode 111 indicated by (2) and denoted by the solid line have the same phase. For this reason, the output signal of the multiplier 131 having a frequency twice the frequency of the AC signal indicated by (3) is obtained as denoted by the solid line, and the output signal of the LPF 132 in the form of a DC signal indicated by (4) is obtained as denoted by the solid line.

In contrast, when the phase adjustment circuit 140 does not perform phase adjustment, the phases of the AC signal of the AC signal source 120 indicated by (1) and the output signal of the detection electrode 111 indicated by (2) and denoted by the dashed line are not the same. For this reason, the DC level of the output signal of the multiplier 131 is decreased as indicated by (3) and denoted by the dashed line, and the output signal of the LPF 132 indicated by (4) and denoted by the dashed line is a DC signal having a signal level lower than that of the DC signal denoted by the solid line.

As described above, the phase of the AC signal input to the active shield electrode 112 is advanced by the amount of the phase delay that occurs in the sensor unit 110 using the phase adjustment circuit 140 in advance and, thus, the output signal of the detection electrode 111 can be in phase with the AC signal output from the AC signal source 120. Therefore, the signal level of the output signal of the detection circuit 130 is maximized as a signal obtained by multiplying the output signal of the detection electrode 111 by the AC signal output from the AC signal source 120 and passing the resultant signal through the LPF 132. This means maximizing the amount of change in the capacitor CH due to the presence or absence of a detection target, such as a finger.

Therefore, it is possible to provide a capacitance detection device 100 and a capacitance detection method capable of reducing a decrease in the detection sensitivity due to the phase delay of a signal. In addition, by reducing a decrease in detection sensitivity, it is possible to provide the capacitance detection device 100 and the capacitance detection method capable of improving the dynamic range in detection. For example, even when a conductive film, such as an ITO film having a resistance value, is used for the detection electrode 111 or the active shield electrode 112, the phase of the AC signal output from the AC signal source 120 can be advanced by using the phase adjustment circuit 140 and, thereafter, the AC signal can be input the active shield electrode 112. Thus, a decrease in the detection sensitivity of the detection circuit 130 can be reduced.

In addition, advancing the phase of the AC signal by using the phase adjustment circuit 140 so that the output signal of the detection electrode 111 and the AC signal of the AC signal source 120 are the same means advancing the phase of the AC signal so that the output signal of the detection electrode 111 and the AC signal are in phase. If the phase of the AC signal is adjusted by the phase adjustment circuit 140, the detection sensitivity of the detection circuit 130 can be improved even when the output signal of the detection electrode 111 and the AC signal of the AC signal source 120 are completely the same, as compared with the case where the phase of the AC signal is not adjusted by the phase adjustment circuit 140. Therefore, if the phase of the AC signal is appropriately advanced by the phase adjustment circuit 140, a decrease in detection sensitivity of the detection circuit 130 can be reduced even when the output signal of the detection electrode 111 and the AC signal of the AC signal source 120 do not completely the same.

Strictly speaking, the phase of the AC signal cannot be advanced. However, the phase adjustment circuit 140 includes the phase shift circuit 140A that delays the phase of an AC signal and the inverting amplifier circuit 140B that inverts the phase of the AC signal. For this reason, the phase of an AC signal can be substantially advanced, and the phase delay that occurs in the sensor unit 110 can be canceled out.

In addition, since the detection circuit 130 includes the multiplier 131 and the LPF 132, the capacitance between the detection electrode 111 and a physical object, such as the hand H, can be detected using the detection circuit 130 having a simplified configuration.

In the above description, the sensor unit 110 includes 12 detection electrodes 111. However, the sensor unit 110 is required to include one or more (one or a plurality of) detection electrodes 111. Any number of electrodes 111 can be included.

Figure 7:
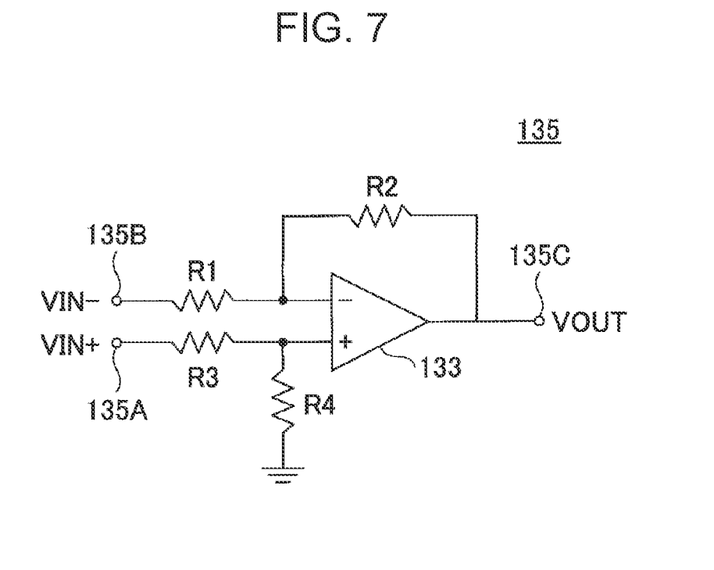
FIG. 7 illustrates a differential amplifier.

In addition, while the above embodiment has been described with reference to the detection circuit 130 including the multiplier 131 and the LPF 132, the detection circuit 130 may have a configuration in which the multiplier 131 is replaced by a differential amplifier. FIG. 7 illustrates a differential amplifier 135. The differential amplifier 135 includes an operational amplifier 133, resistors R1 to R4, input terminals 135A and 135B, and an output terminal 135C. The input terminals 135A and 135B and the output terminal 135C of the differential amplifier 135 can be connected instead of the two input terminals and the output terminal of the multiplier 131. That is, the differential amplifier 135 amplifies and outputs the voltage difference between the inverting input terminal 135B connected to the detection electrode 111 and the non-inverting input terminal 135A to which the AC signal is applied. The differential amplifier 135 amplifies the difference between the signals VIN+ and VIN− input to the two input terminals and outputs the difference from the output terminal. When the output of the differential amplifier 135 is input to the LPF 132, an output signal similar to that of the detection circuit 130 including the multiplier 131 and the LPF 132 is obtained. Therefore, it is possible to reduce a decrease in detection sensitivity of a detection circuit including a differential amplifier. Moreover, the detection circuit 130 can set an integrator circuit using an operational amplifier between the input terminal 130A and the multiplier 131.

Figure 8:
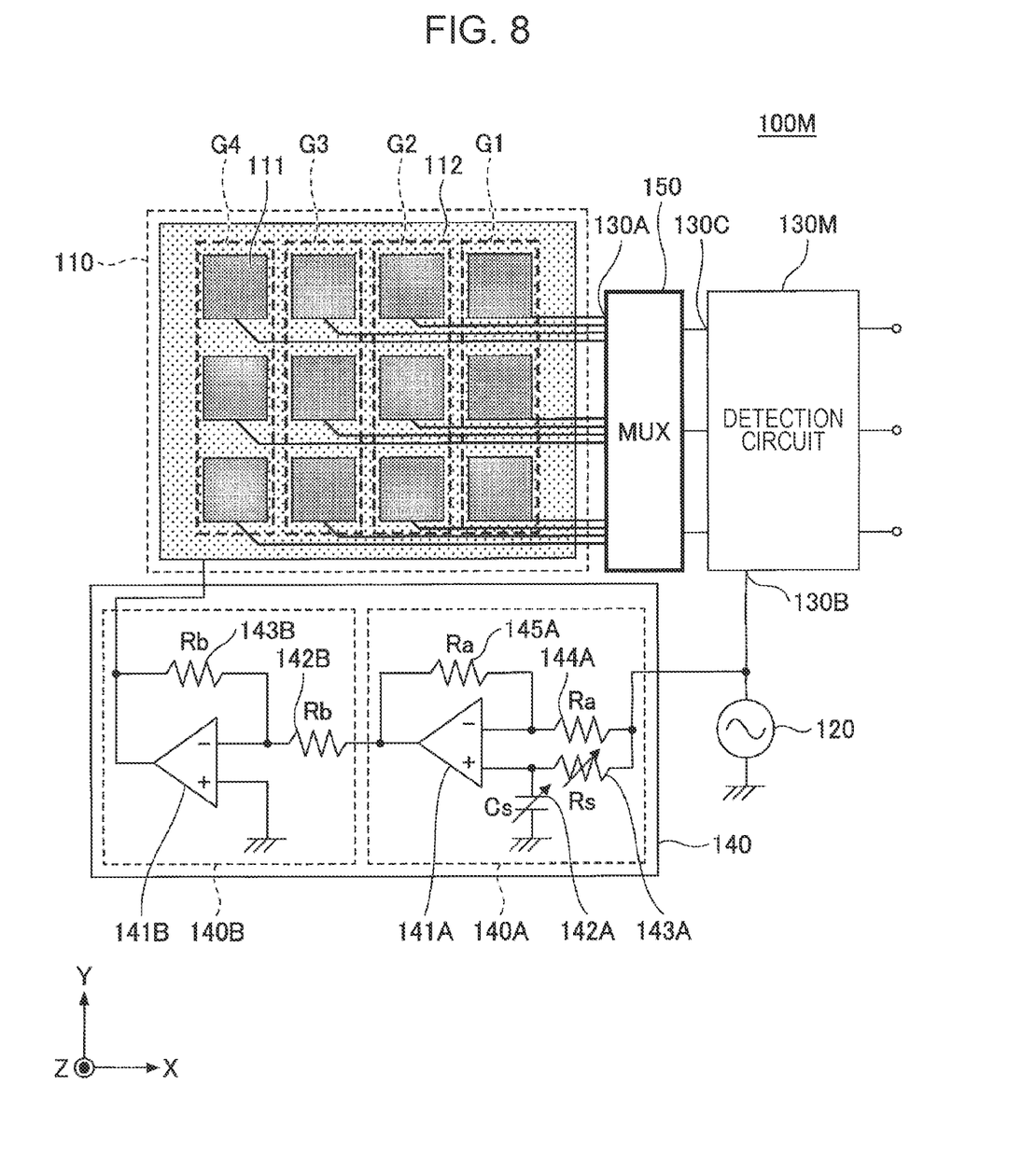
FIG. 8 illustrates a capacitance detection device according to a modification of the embodiment.

In addition, as illustrated in FIG. 8, a configuration including a multiplexer (MUX) 150 may be employed. In this case, a plurality of detection electrodes 111 are provided. FIG. 8 illustrates a capacitance detection device 100M according to a modification of the embodiment. The capacitance detection device 100M has a configuration including a multiplexer 150 on the output side of the sensor unit 110 and a detection circuit 130M instead of the detection circuit 130. The multiplexer 150 corresponds to a selection unit and selects one or a plurality of detection electrodes 111 out of the plurality of detection electrodes 111 in a time division manner. Furthermore, the detection circuit 130M detects the capacitance between a physical object in close vicinity of the detection electrode 111 and the detection electrode 111 on the basis of the detection signal output from the detection electrode 111 selected by the multiplexer 150 (the selection unit) and the AC signal output from the AC signal source 120. The phase adjustment circuit 140 adjusts the phase lead amount of an AC signal in accordance with the one or plurality of detection electrodes 111 selected by the multiplexer 150.

The multiplexer 150 is provided between the sensor unit 110 and the detection circuit 130M, divides the 12 detection electrodes 111 into four groups G1 to G4 in the X direction, acquires the output signals in a time division manner, and outputs the output signals to the detection circuit 130M. Since the three detection electrodes 111 included in group G1 are closest to the multiplexer 150, the interconnection wire length to the multiplexer 150 is the shortest and, thus, the resistance of the interconnection wire is the lowest among the groups G1 to G4. The three detection electrodes 111 included in the group G4 are the farthest from the multiplexer 150 and therefore have the longest interconnection wire length to the multiplexer 150. Thus, the three detection electrodes 111 have the highest wire resistance among the groups G1 to G4. When the difference in the time constant due to the difference in interconnection wire length has a large impact on the detection result of the capacitance detection device 100M as the phase difference output from the detection electrode 111, the configuration of the capacitance detection device 100M is effective.

The detection circuit 130M detects the capacitance between the three detection electrodes 111 and the physical object, such as the hand H, on the basis of the output signals of the three detection electrodes 111 included in each of the groups G1 to G4 and the AC signal output from the AC signal source 120 in a time division manner. Therefore, the detection circuit 130M is required to have three multipliers 131 and three LPFs 132.

Figure 9A:
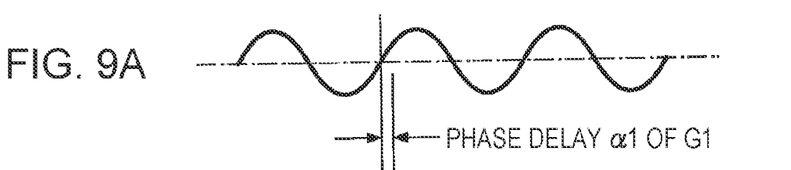
FIGS. 9A to 9C illustrate the signal waveforms in units of the capacitance detection device.
Figure 9B:
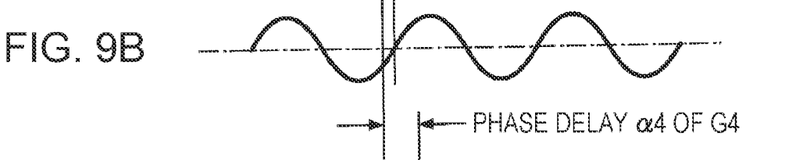
Figure 9C:
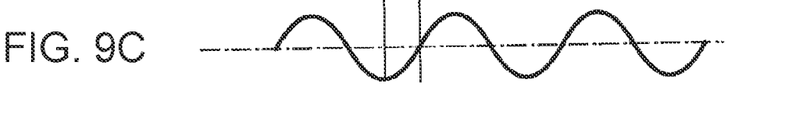

FIGS. 9A to 9C illustrate the signal waveform of each element of the capacitance detection device 100M. "(A)" represents the AC signal of the AC signal source 120, "(B)" represents the output signal of the detection electrodes 111 included in the group G1 when the phase adjustment amount in the phase adjustment circuit 140 is 0 degrees, and "(C)" represents the output signals of the detection electrodes 111 included in the group G4 when the phase adjustment amount in the phase adjustment circuit 140 is 0 degrees. When one compares the group G1 with the group G4, the phase delay α1 degrees of the output signal of the detection electrode 111 in the group G1, which is closer to the multiplexer 150 and has a shorter interconnection wire length, is less than the phase delay α4 degrees of the output signal of the detection electrode 111 in the group G4. This is because the time constant decreases with decreasing interconnection wire length.

Figure 10:
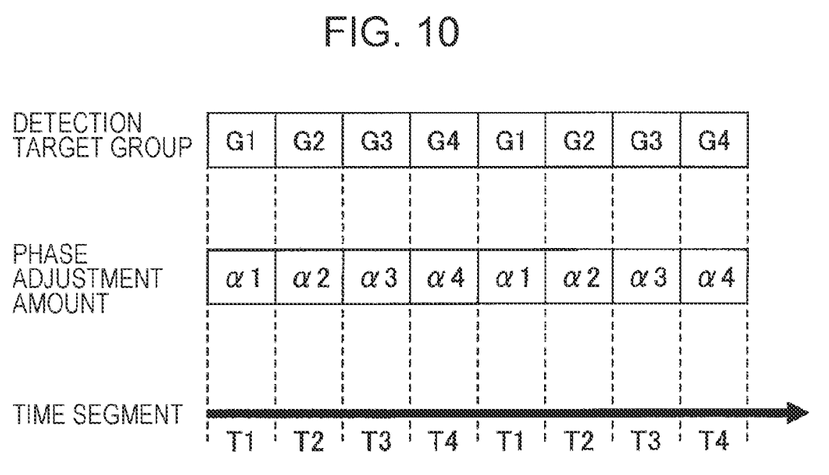
FIG. 10 is a diagram describing a phase adjustment amount in a phase adjustment circuit of the capacitance detection device.

FIG. 10 is a diagram describing the phase adjustment amounts in the phase adjustment circuit 140 of the capacitance detection device 100M. FIG. 10 illustrates groups G1 to G4 to be detected, phase adjustment amounts α1 to α4, and time segments T1 to T4. The time period for detecting the groups G1 to G4 is divided into T1 to T4 (time segments). In the time segments T1 to T4, the phase adjustment circuit 140 can advance the phase of the AC signal input from the AC signal source 120 by the phase adjustment amounts of α1 degrees to α4 degrees, respectively. In this way, by using the phase adjustment amounts of α1 degrees to α4 degrees each corresponding to the interconnection wire length of one of the groups, the output signal output from the detection electrode 111 in each of the groups G1 to G4 can be matched with the AC signal output from the AC signal source 120 in the detection circuit 130M, and the capacitance between the detection electrode 111 and a physical object, such as the hand H, can be detected.

Therefore, it is possible to provide the capacitance detection device 100M and the capacitance detection method capable of reducing a decrease in the detection sensitivity due to the phase delay of a signal. In particular, when the difference in the phase of the output signal due to the difference in interconnection wire length between the plurality of detection electrodes 111 has an impact on the detection result, it is very effective to detect the capacitance in a time division manner using the multiplexer 150 and to set a phase adjustment amount for each group. According to the capacitance detection device 100M, the highest signal level of the output signal of the detection circuit 130M is obtained as a signal obtained by multiplying the output signal of the detection electrode 111 by the AC signal output from the AC signal source 120 and passing the resultant signal through the LPF 132 for each group.

While the capacitance detection device and the capacitance detection method according to the exemplary embodiment of the present invention have been described above, the present invention is not limited to the specifically disclosed embodiment, and various changes and modifications can be made without departing from the scope of the claims.

What is claimed is:

1. A capacitance detection device comprising:
   at least one detection electrode configured to output a detection signal associated with a capacitance formed between the detection electrode and an object in proximity of the detection electrode;
   an AC signal source configured to output an AC signal;
   a shield electrode disposed in a vicinity of the detection electrode, the shield electrode being to receive the AC signal;
   a detection circuit configured to detect the capacitance between the object and the detection electrode based on the detection signal received from the detection electrode and the AC signal received from the AC signal source; and
   a phase adjustment circuit provided between the AC signal source and the shield electrode, the phase adjustment circuit being configured to supply the AC signal to the shield electrode by advancing a phase of the AC signal output from the AC signal source.

2. The capacitance detection device according to claim 1, wherein the phase adjustment circuit advances the phase of the AC such that the detection signal and the AC signal input to the detection circuit are in phase.

3. The capacitance detection device according to claim 1, wherein the phase adjustment circuit includes:
   a phase shift circuit configured to delay the phase of the AC signal; and
   an inverting amplifier configured to invert the phase of the AC signal.

4. The capacitance detection device according to claim 1, wherein the detection circuit includes:
   a multiplier configured to multiply the detection signal by the AC signal received from the AC signal source, thereby outputting a multiplied signal.

5. The capacitance detection device according to claim 4, wherein the detection circuit further includes:
   a low pass filter configured to block a frequency band component of the multiplied signal higher than a cutoff frequency.

6. The capacitance detection device according to claim 1, wherein the detection circuit includes:
   an operational amplifier having an inverting input terminal connected to the detection electrode, and a non-inverting input terminal connected to the AC signal source, the operational amplifier being configured to amplify and output a voltage difference between the inverting input and the non-inverting terminal.

7. The capacitance detection device according to claim 1, wherein the at least one detection electrode includes a plurality of detection electrodes, the capacitance detection device further comprising:
   a selection unit configured to select at least one detection electrode from among the plurality of detection electrodes in a time division manner,
   wherein the detection circuit is configured to detect the capacitance between the object and the detection electrode based on the detection signal output from the at least one detection electrode selected by the selection unit and the AC signal received from the AC signal source, and
   wherein the phase adjustment circuit is configured to adjust an amount of phase lead in the AC signal with respect to the at least one detection electrode selected by the selection unit.

8. The capacitance detection device according to claim 1, wherein the detection signal includes:
   a detection component corresponding to the capacitance between the detection electrode and the object; and
   an AC component corresponding to the AC signal supplied to the shield electrode.

9. A capacitance detection method using a capacitance detection device including at least one detection electrode and a shield electrode disposed in a vicinity of the detection electrode, the method comprising:
   outputting an AC signal from an AC signal source;
   supplying the AC signal to the shield electrode;
   outputting, from the detection electrode, a detection signal associated with a capacitance formed between the detection electrode and an object in proximity of the detection electrode; and
   detecting the capacitance between the object and the detection electrode based on the detection signal received from the detection electrode and the AC signal received output from the AC signal source,
   wherein the supplying the AC signal to the shield electrode includes:
   advancing a phase of the AC signal output from the AC signal source before supplying to the shield electrode.

10. The capacitance detection method according to claim 9, wherein the detection signal includes:
    a detection component corresponding to the capacitance between the detection electrode and the object; and
    an AC component corresponding to the AC signal supplied to the shield electrode.

11. The capacitance detection method according to claim 9, wherein the advancing the phase including:
    adjusting the phase of the AC signal such that the detection signal output from the detection electrode and the AC signal input to the detection circuit are in phase.

* * * * *